United States Patent
Bergemont et al.

(10) Patent No.: US 7,324,387 B1
(45) Date of Patent: Jan. 29, 2008

(54) LOW POWER HIGH DENSITY RANDOM ACCESS MEMORY FLASH CELLS AND ARRAYS

(75) Inventors: Albert Bergemont, Palo Alto, CA (US); Venkatraman Prabhakar, Pleasanton, CA (US); Keyhan Sinai, Santa Clara, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 11/732,323

(22) Filed: Apr. 2, 2007

Related U.S. Application Data

(63) Continuation of application No. 11/406,116, filed on Apr. 18, 2006, now abandoned.

(51) Int. Cl.
*G11C 16/04* (2006.01)

(52) U.S. Cl. .......................... 365/185.33; 365/185.22; 365/185.29

(58) Field of Classification Search ........... 365/185.33, 365/185.22, 185.29, 185.18, 63, 230.03
See application file for complete search history.

(56) References Cited

U.S. PATENT DOCUMENTS

| | | | | |
|---|---|---|---|---|
| 5,946,232 A | * | 8/1999 | Yoon | ..................... 365/185.11 |
| 5,964,232 A | * | 10/1999 | Chung | ........................ 134/176 |
| 6,262,914 B1 | * | 7/2001 | Smayling et al. | ...... 365/185.11 |
| 6,498,752 B1 | | 12/2002 | Hsu et al. | |
| 6,628,563 B1 | | 9/2003 | Hsu et al. | |
| 7,177,199 B2 | | 2/2007 | Chen et al. | |
| 2002/0196696 A1 | | 12/2002 | Chevallier et al. | |

\* cited by examiner

*Primary Examiner*—Gene N. Auduong
(74) *Attorney, Agent, or Firm*—Blakely Sokoloff Taylor & Zafman LLP

(57) ABSTRACT

Low power high density random access memory flash cells and arrays using Fowler Nordheim (FN) tunneling for both programming and erasing. The memory array is divided into sectors, each sector comprising a predetermined number of rows. The bit lines are similarly segmented, each global bit line being selectively connectable to a local bit line for each sector, each local bit line being connected to the drains of all floating gate cells in a respective column of each sector. The sources of all floating gate cells in a respective column of each sector are connected to a local source line for that sector, the local source lines for each sector being controllably connectable to respective global source lines. Consequently all floating gate cells within a column of a sector are connected in parallel, source to source and drain to drain. Representative programming and erase voltages not disturbing other cells are disclosed.

24 Claims, 5 Drawing Sheets

LOW POWER HIGH DENSITY RANDOM ACCESS MEMORY FLASH CELLS AND ARRAYS

CROSS-REFERENCE TO RELATED APPLICATION

This application is a continuation of U.S. patent application Ser. No. 11/406,116 filed Apr. 18, 2006 now abandoned.

BACKGROUND OF THE INVENTION

1. Field of the Invention

The present invention relates to the field of flash memories.

2. Prior Art

Flash memory has the advantages of being selectively erasable, relatively inexpensive nonvolatile memory, and is used in a very wide variety of products to retain information after power is shut off. Currently the mainstream flash technology is referred to as ETOX (erasable tunnel oxide) which uses Channel hot electron (CHE) programming (FIG. 1) and Fowler Nordheim (FN) tunneling for erasing (FIG. 2). The programming mechanism (CHE) is fast, but consumes a lot of power (~300 to 500 μA per bit), while the erasing mechanism (FN) has a low power dissipation (~1 pA/bit). In portable systems, there is a need for non-volatile memory with low power consumption for both programming and erasing.

FIG. 3 illustrates a typical ETOX cell layout. In this Figure, regions 20 and 22 are contact regions between a voltage sources and an active region below. Specifically, region 20 provides a contact between the Vss line and the common source lines. In that regard, all cells share a common source. Each cell shares its drain contact with the adjacent cell on the same bit line through contacts 22. Access transistors for the bit lines BL1 and BL2 are not shown. The word lines WL1 and WL2 extend across the entire array and form the gate lines, with floating gates 24 between the word lines and the active regions there below. Table 1 shows the voltages required to selectively program cell A.

TABLE 1

|  | BL1 | BL2 | WL1 | WL2 | Source |
|---|---|---|---|---|---|
| Program A | 6 V |  | 12 V |  | Vs. |
| Program Inhibit B |  | Vs. | 12 V |  | Vs. |
| Program Inhibit C | 6 V |  |  | Vs. | Vs. |
| Program Inhibit D |  | Vs. |  | Vs. | Vs. |
| Block Erase all cells | float | float | Vs. | Vs. | 12 V |

Also known are NAND flash memories. These memories are programmed and erased using Fowler Nordheim tunneling. In these memories, typically 8 or 16 cells are connected in series, drain to source, drain to source, with each NAND block being programmed serially. The NAND cells have the advantage of small size, but characteristically have long random access read times.

DETAILED DESCRIPTION OF THE PREFERRED EMBODIMENTS

In accordance with a preferred embodiment of the present invention, a new cell is disclosed wherein the programming is achieved by Fowler Nordheim tunneling of electrons from the P-substrate to the floating gate, and the erase is accomplished using the same mechanism in the opposite direction. As compared to other approaches, cells of the present invention consume low power in both programming and erasing. This is particularly attractive in applications such as battery powered applications, where energy saving is highly advantageous.

Figure 4:
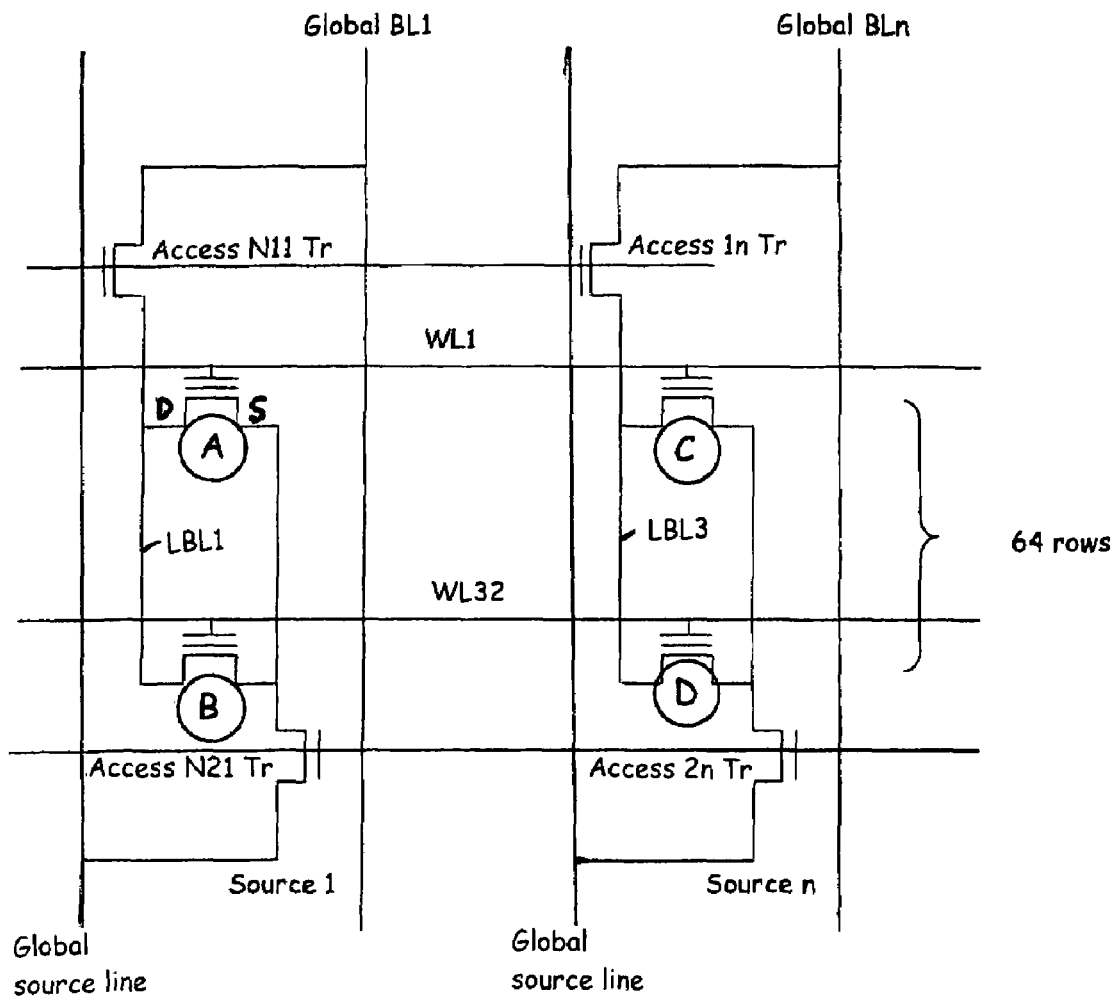
FIG. 4 illustrates a preferred embodiment of the present invention.

A preferred embodiment of the present invention may be seen in FIG. 4. One particular feature of the flash array of the preferred embodiment is that it is bit line segmented, with global bit lines running through the array, and local bit lines LBL off the global bit lines addressing a predetermined number of rows in the array. Generally if there are M rows in the entire matrix, and X rows coupled to each local bit line, then there will be m=1 to M/X local bit lines off of each global bit line. In a preferred embodiment, X equals 64 consecutive rows within the array, referred to herein as a sector. In FIG. 4, the 64 rows are indicated, though for clarity, only the first row coupled to word line WL1 and the $32^{nd}$ row coupled to word line WL32 is shown. Each sector (64 rows) is addressed through a bank of high voltage access transistors on each side of the sector (not shown in FIG. 4, but see FIG. 5), creating local bit lines LBLn (n=1 to N, where N=M/X), each for a respective column of 64 cells within each sector. More particularly, global bit lines BLn (n=1 to N) run vertically through the entire array (FIG. 4), with high voltage access transistors selectively coupling local bit lines for each sector to the respective global bit lines. Each local bit line is connected to the drains of storage cells (AB, CD) in the respective column of 64 cells in a sector by N-channel access transistors Access N1nTr (n=1 to N). The source connections for each column of 64 cells are provided by high voltage N-channel access transistors Access N2nTr (n=1 to N) on the opposite sides of the columns selectively coupling local source lines to the global source lines.

Thus to realize the segmentation discussed, each 64 rows are connected:

On the drain side to a local bit line, each local bit line being selectively connectable to a global bit line through an N-channel high voltage access transistor.

On the source side to a local source line, each local source line being selectively connectable to a global source line through an N-channel high voltage select transistor.

Figure 5:
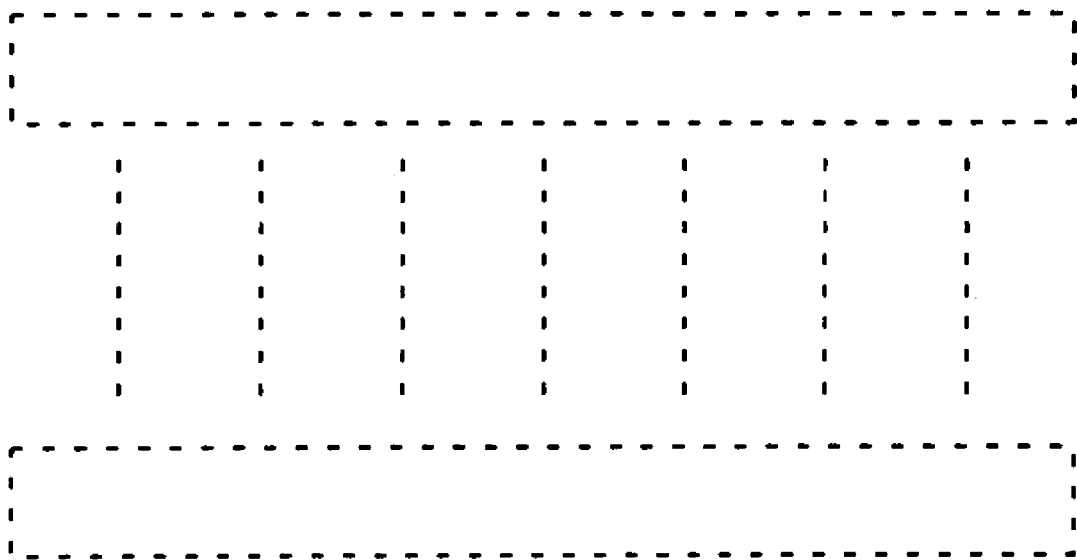
FIG. 5 is an illustration of the separate isolation wells used in an embodiment of the present invention.

Each sector of storage cells, as well as its N-channel high voltage select transistors, seats in its own P-well (see FIG. 5). Thus there are three wells total per sector, including the wells for the access transistors. However, while the programming and erase modes of the preferred embodiment depend on being able to independently change the voltages of wells for each sector of storage cells, this is not required for the access transistor wells, and in the preferred embodiment, all wells for access transistors are electrically tied together by metal interconnects on the chip.

This architecture offers the possibility to erase only one word line or one sector (64 rows). Furthermore, this segmentation feature insures a fast read path, as the bit line capacitance is limited to only one sector, and improves the control of the erased population.

Figure 1:
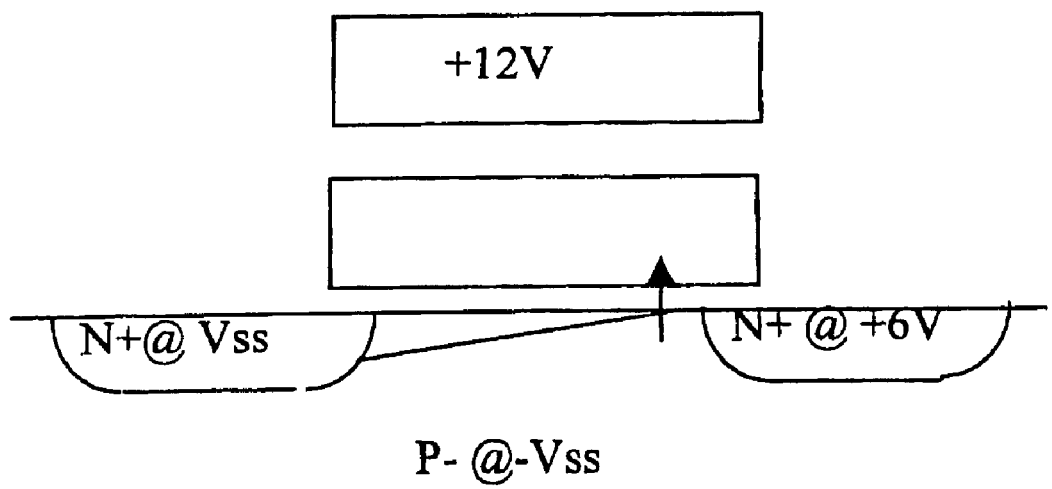
FIG. 1 illustrates Channel hot electron (CHE) programming of the prior art ETOX (erasable tunnel oxide) flash technology.
Figure 2:
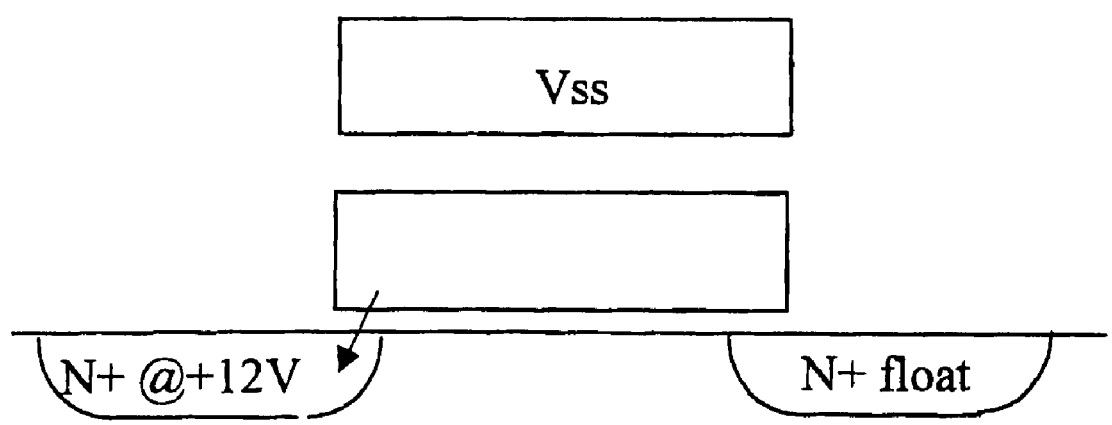
FIG. 2 illustrates Fowler Nordheim (FN) tunneling for erasing of the prior art ETOX (erasable tunnel oxide) flash technology.
Figure 3:
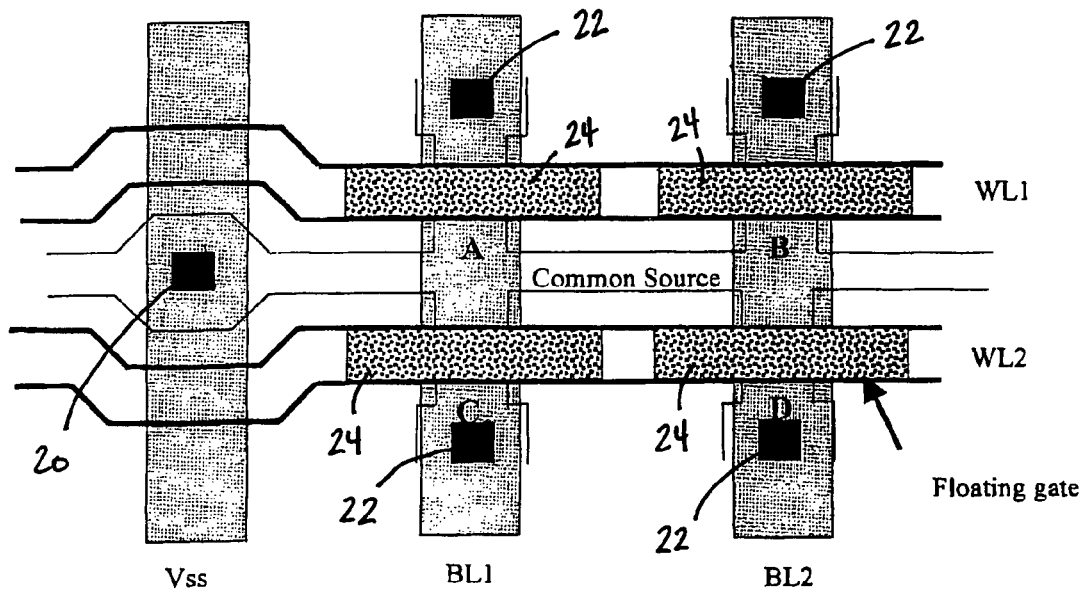
FIG. 3 illustrates a typical prior art ETOX cell layout.
Figure 6:
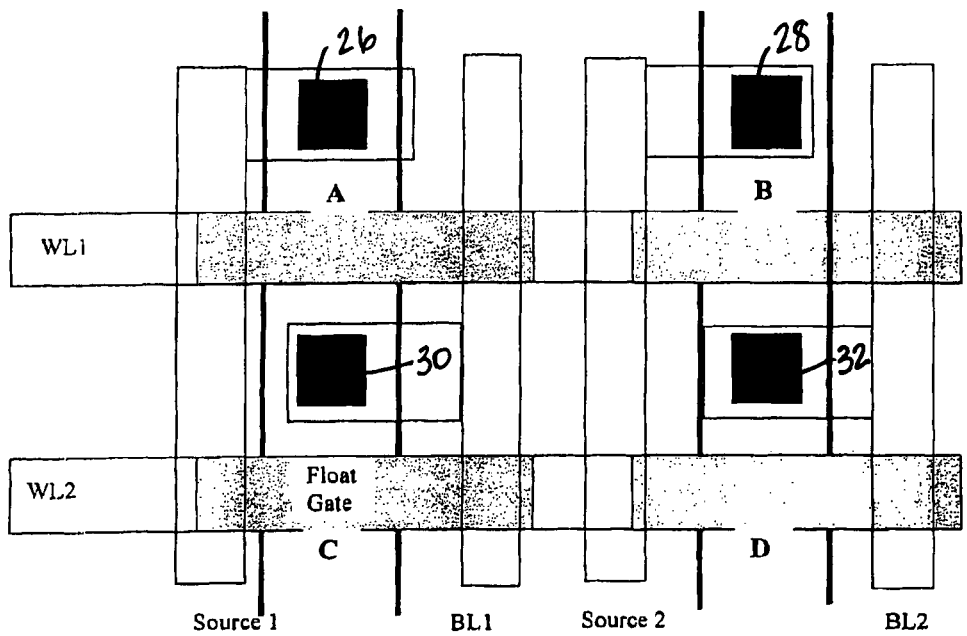
FIG. 6 presents the schematic of four flash cells within a sector.

FIG. 6 presents the schematic of four flash cells within a sector. Each cell A, B, C, D has its own drain and source contact. The cells do not share the source line with the other cells on the same row (the ETOX cell does). The source and drain of each cell is contacted through vertical metal lines, one for the sources and one for the drains. Within a sector, the source lines Source 1 and Source 2 are local source lines, and the bit lines BL1 and BL2 contacting the drains within a column within a sector are local bit lines. Contacts 26 and 28 provide source contacts to the source areas of cells A and B respectively. Contact 30 provides drain contacts to the drain areas of cells A and C, and contact 32 provides drain contacts to the drain areas of cells B and D. Thus the source and drain contacts between rows in each column of a sector alternate between cells, and each make the respective contact for the cell above and the cell below the contact.

Table 2 highlights the array selective programming operation on cell A. With global bit line at −5V, the HV access transistor N11 on with its gate at 7V, P-wells at −5V, the global bit line voltage −5V is passed to the local bit line of the selected sector. With the word line WL1 at 11V, the programming operation is accomplished by tunneling the electrons from the channel of the selected cell to its floating gate through Fowler Nordheim tunneling (the field through the oxide is ~10 MV/cm).

TABLE 2

|  | Program A | Program Inhibit C | Program Inhibit B | Program Inhibit D |
|---|---|---|---|---|
| Access Tr N11, N1n | 7 V (on) |  | 7 V (on) |  |
| Access Tr N21, N2n | Vss (off) |  | Vss (off) |  |
| Global BL1 | −5 V |  | −5 V |  |
| WL1 | 11 V | 11 V |  |  |
| Source 1 | float |  | float |  |
| Global BLn |  | Vcc |  | Vcc |
| WL32 |  |  | Vss | Vss |
| Source n |  | float |  | float |
| P- Well Cells Sector1 | −5 V | −5 V | −5 V | −5 V |
| P- Well Acc Tr all sectors | −5 V | −5 V | −5 V | −5 V |
| P- Well Cells Sector n | Vss | Vss | Vss | Vss |

During this operation, all the other cells sharing the same WL, local BL or global BL, shouldn't be disturbed. Disturb in this sense means that any cell can be programmed and any line erased a predetermined number of times without changing the state of any other cells in the array. In the exemplary embodiment, the predetermined number is 100,000, or 1E5. For a 10 ms programming or erase pulse, and considering there are 64 rows in each sector, the total disturb time is taken as a total of 6E4 seconds during which the programming state of any cell cannot change upon the programming and erase of other cells in the same sector, the cells in other sectors being effectively isolated from programming and erase voltages by their access transistors being off. One consideration regarding the choice of 64 rows per sector is to limit the extent of disturb for the required cycles of operation of adjacent cells.

Two kinds of programming disturb have been considered:

1. Cells sharing the same WL at 11V in the selected sector: Consider non-programmed cell C. The duration of the disturb for a single programming operation is 10 ms. The selectivity is achieved by having the global bit line BLn of the unselected cell at a positive potential, Vcc, such as 3 to 4 volts, in order to have the channel of this unselected cell at Vcc. Under these conditions, Vss (ground) will disturb and 2.7V inhibits the disturb. In that case, the cell C is on, in inversion and the voltage through the tunnel oxide is 11−2.7−1=7.3V.

2. Programming disturb on the same column (cell B); In this case cell B will see the same BL1 potentials (−5V) as the programmed cell; with its word line WL64 at Vss, as well as the same P-well at −5V, the voltage through the tunnel oxide is 4V, taking in account that the cell is in inversion. It has been shown that the population of cell C stays within the erase margins (0.5 to 1.5V VTE) after 1E5*10 ms*64=6E4 sec.

Table 3 highlights the row selective erasing operation on row 1. With global bit lines at +3V, the HV access transistor N11 on with its gate at 9V, P-wells at Vss, the global bit line voltage Vss is passed to the local bit lines of the selected sector. With the word line WL1 at −11V, the programming operation is accomplished by tunneling the electrons from the channel of the selected cell to its floating gate through Fowler Nordheim tunneling (the field through the oxide is ~10 MV/cm).

TABLE 3

|  | Erase Row 1 | EraseInhibit Row 32 |
|---|---|---|
| Access Tr N11, N1n | 9 V (on) | 9 V (on) |
| Access Tr N21, N2n | Vss (off) | Vss (off) |
| Global B11 | +3 V | +3 V |
| WL1 | −11 V |  |
| Source 1 | float | float |
| Global BLn | +3 V | +3 V |
| WL32 |  | Vss |
| Source n | float | float |
| P- Well Cells Sector 1 | +3 V | +3 V |
| P- Well Acc Tr all sectors | Vss | Vss |
| P- Well Cells Sector n | Vss | Vss |

During this operation all the other cells, sharing the same local BL within a sector or sharing the same global bit line in other sectors, shouldn't be disturbed.

Two kinds of erasing disturb have been considered:

1. Erasing disturb on the same column within the sector: In this case a cell on a different row will see the same local source and BL potentials as the erased row, i.e., BL at 3V, as well as the same P-well at Vss. As the cell is in accumulation, the voltage through the tunnel oxide is 3V; the duration of the disturb is 1E5*10 ms*63=6E4 sec. Under these conditions, disturb is inhibited.

2. Erasing disturb on the same column in other sectors: In this case the other sectors are sharing the same global source and BL potentials (float and 3V). With the unselected sectors high voltage access transistors off (gate at Vss) P-well at Vss, the situation is equipotential, avoiding any disturb.

Figure 7:
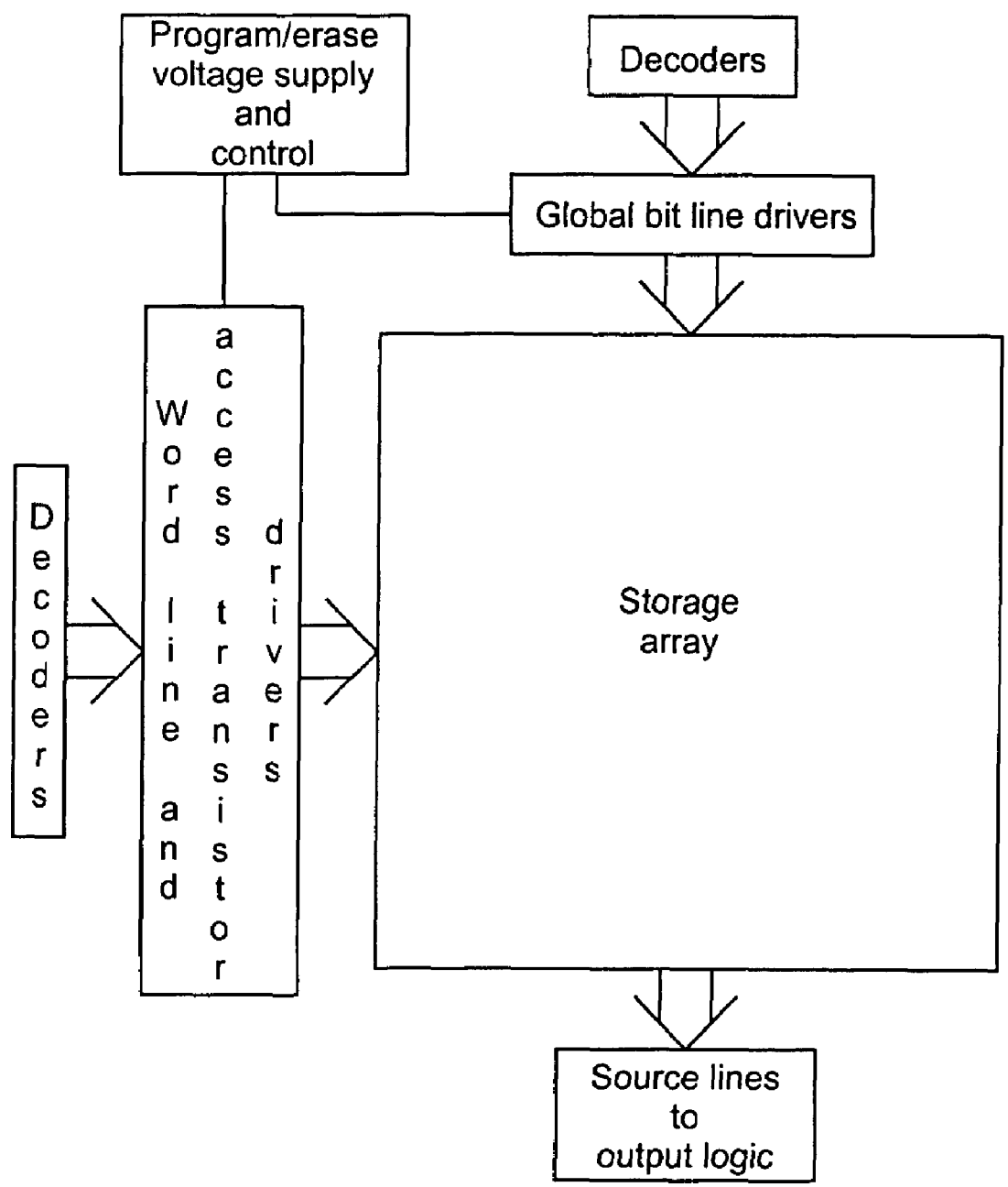
FIG. 7 presents a schematic representation of a complete memory in accordance with the present invention.

Thus, the memory array is divided into sectors, each sector comprising a predetermined number of rows. The bit lines are similarly segmented, each global bit line being selectively connectable to a local bit line for each sector, each local bit line being connected to the drains of all floating gate cells in a respective column of each sector. The sources of all floating gate cells in a respective column of each sector are connected to a local source line for that sector, the local source lines for each sector being controllably connectable to respective global source lines. Consequently all floating gate cells within a column of a sector are connected in parallel, source to source and drain to drain. The sector size in the embodiment disclosed is 64 lines, though that is a matter of design choice, not a limitation of the invention. However as an upper limit, the sector size should be chosen so as assure operation over the required number of operations without loosing data stored in any cell. In general, the preferred embodiment does not have as high a cell density as some prior art flash memories, using the same technology, but has the advantage of very low power required for both programming and erase, and at the same time provides good random access speeds, characteristics of great value in such devices as battery operated devices. A schematic representation of a complete memory in accordance with the present invention is presented in FIG. 7.

While a preferred embodiment of the present invention has been disclosed and described herein for purposes of illustration and not for purposes of limitation, it will be understood by those skilled in the art that various changes in form and detail may be made therein without departing from the spirit and scope of the invention.

What is claimed is:

1. A flash memory comprising:
   an array of rows and columns of floating gate memory cells, each memory cell having a source, a drain, a gate and a floating gate;
   the array including a global bit line and a global source line for each column of cells, the rows of cells being grouped in sectors, each sector including a predetermined number of rows, the drains of all cells in any selected column of any selected sector being coupled together and controllably couplable to a global bit line through first access transistors, the sources of all cells in any selected column of any selected sector being coupled together and controllably couplable to a global source line through second access transistors;
   the gates of the floating gate memory cells in each row of floating gate memory cells being connected to a respective word line;
   circuitry configured to controllably provide a voltage of a first polarity between the gate and the drain of one or more selected cells in a sector to program the selected cell by Fowler Nordheim tunneling without disturbing the state of other cells; and,
   to controllably provide a voltage of a second polarity opposite the first polarity between the gate and the drain of one or more selected rows of cells to erase the selected rows of cells by Fowler Nordheim tunneling without disturbing cells in unselected rows of cells.

2. The flash memory of claim 1 wherein on erase, the circuitry provides the voltage of a second polarity to a single row in a sector.

3. The flash memory of claim 1 wherein on erase, the circuitry provides the voltage of a second polarity to all rows in a sector.

4. The flash memory of claim 1 wherein adjacent floating gate memory cells within a column of a sector are physically oriented source to source and drain to drain, whereby a single contact may make contact with two drains or two sources.

5. The flash memory of 1 wherein the number of rows in a sector is 64.

6. The flash memory of claim 1 wherein the circuitry configured to controllably provide a voltage of a first polarity between the gate and the drain of one or more selected cells in a sector to program the selected cell by Fowler Nordheim tunneling also comprises circuitry for restricting voltages on floating gate memory cells not intended to be programmed to lesser voltages not disturbing the state of the floating gate memory cells not intended to be programmed.

7. The flash memory of claim 1 wherein the circuitry to controllably provide a voltage of a second polarity opposite the first polarity between the gate and the drain of one or more selected rows of cells to erase the selected rows of cells by Fowler Nordheim tunneling without disturbing cells in unselected rows of cells comprises circuitry for restricting voltages on floating gate memory cells not intended to be erased to lesser voltages not disturbing the programming of the floating gate memory cells not intended to be erased.

8. A flash memory comprising:
   an array of rows and columns of floating gate memory cells, each memory cell having a source, a drain, a gate and a floating gate;
   the array including a global bit line and a global source line for each column of cells, the rows of cells being grouped in sectors, each sector including a predetermined number of rows, the drains of all cells in any selected column of any selected sector being coupled together and controllably couplable to a global bit line through first access transistors, the sources of all cells in any selected column of any selected sector being coupled together and controllably couplable to a global source line through second access transistors;
   the gates of the floating gate memory cells in each row of floating gate memory cells being connected to a respective word line;
   circuitry configured to controllably provide a voltage of a first polarity between the gate and the drain of one or more selected cells in a sector to program the selected cell by Fowler Nordheim tunneling and restricting voltages on floating gate memory cells not intended to be programmed to lesser voltages not disturbing the state of the floating gate memory cells not intended to be programmed; and,
   to controllably provide a voltage of a second polarity opposite the first polarity between the gate and the drain of one or more selected rows of cells to erase the selected rows of cells by Fowler Nordheim tunneling and for restricting voltages on floating gate memory cells not intended to be erased to lesser voltages not disturbing the programming of the floating gate memory cells not intended to be erased.

9. The flash memory of claim 8 wherein on erase, the circuitry provides the voltage of a second polarity to a single row in a sector.

10. The flash memory of claim 8 wherein on erase, the circuitry provides the voltage of a second polarity to a all rows in a sector.

11. The flash memory of claim 8 wherein adjacent floating gate memory cells within a column of a sector are physically oriented source to source and drain to drain, whereby a single contact may make contact with two drains or two sources.

12. The flash memory of 8 wherein the number of rows in a sector is 64.

13. A low power program and erase flash memory method comprising:

provide an array of rows and columns of floating gate memory cells, each memory cell having a source, a drain, a gate and a floating gate, the array including a global bit line and a global source line for each column of cells, the rows of cells being grouped in sectors, each sector including a predetermined number of rows, the drains of all cells in any selected column of any selected sector being coupled together and controllably couplable to a global bit line through first access transistors, the sources of all cells in any selected column of any selected sector being coupled together and controllably couplable to a global source line through second access transistors, the gates of the floating gate memory cells in each row of floating gate memory cells being connected to a respective word line;

controllably providing a voltage of a first polarity between the gate and the drain of one or more selected cells in a sector to program the selected cell by Fowler Nordheim tunneling without disturbing the state of other cells; and, controllably providing a voltage of a second polarity opposite the first polarity between the gate and the drain of one or more selected rows of cells to erase the selected rows of cells by Fowler Nordheim tunneling without disturbing cells in unselected rows of cells.

14. The method of claim 13 wherein on erase, one row is selected.

15. The method of claim 13 wherein on erase, all rows of a sector are selected.

16. The method of claim 13 wherein adjacent floating gate memory cells within a column of a sector are physically oriented source to source and drain to drain, whereby a single contact may make contact with two drains or two sources.

17. The method of 13 wherein the number of rows in a sector is 64.

18. The method of claim 13 wherein controllably providing a voltage of a first polarity between the gate and the drain of one or more selected cells in a sector to program the selected cell by Fowler Nordheim tunneling also restricts voltages on floating gate memory cells not intended to be programmed to lesser voltages not disturbing the state of the floating gate memory cells not intended to be programmed.

19. The flash memory of claim 13 wherein controllably providing a voltage of a second polarity opposite the first polarity between the gate and the drain of one or more selected rows of cells to erase the selected rows of cells by Fowler Nordheim tunneling without disturbing cells in unselected rows of cells also restricts voltages on floating gate memory cells not intended to be erased to lesser voltages not disturbing the programming of the floating gate memory cells not intended to be erased.

20. A low power program and erase flash memory method comprising:

providing an array of rows and columns of floating gate memory cells, each memory cell having a source, a drain, a gate and a floating gate, the array including a global bit line and a global source line for each column of cells, the rows of cells being grouped in sectors, each sector including a predetermined number of rows, the drains of all cells in any selected column of any selected sector being coupled together and controllably couplable to a global bit line through first access transistors, the sources of all cells in any selected column of any selected sector being coupled together and controllably couplable to a global source line through second access transistors, the gates of the floating gate memory cells in each row of floating gate memory cells being connected to a respective word line;

controllably providing a voltage of a first polarity between the gate and the drain of one or more selected cells in a sector to program the selected cell by Fowler Nordheim tunneling and restricting voltages on floating gate memory cells not intended to be programmed to lesser voltages not disturbing the state of the floating gate memory cells not intended to be programmed; and, controllably providing a voltage of a second polarity opposite the first polarity between the gate and the drain of one or more selected rows of cells to erase the selected rows of cells by Fowler Nordheim tunneling and restricting voltages on floating gate memory cells not intended to be erased to lesser voltages not disturbing the programming of the floating gate memory cells not intended to be erased.

21. The method of claim 20 wherein on erase, one row is selected.

22. The method of claim 20 wherein on erase, all rows of a sector are selected.

23. The method of claim 20 wherein adjacent floating gate memory cells within a column of a sector are physically oriented source to source and drain to drain, whereby a single contact may make contact with two drains or two sources.

24. The method of 20 wherein the number of rows in a sector is 64.

\* \* \* \* \*